United States Patent
Kaneda (10) Patent No.: US 8,754,337 B2
(45) Date of Patent: Jun. 17, 2014

(54) PRINTED WIRING BOARD FABRICATION METHOD, PRINTED WIRING BOARD, MULTILAYER PRINTED WIRING BOARD, AND SEMICONDUCTOR PACKAGE

(75) Inventor: Kenichi Kaneda, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 225 days.

(21) Appl. No.: 13/262,303

(22) PCT Filed: Mar. 26, 2010

(86) PCT No.: PCT/JP2010/055401
§ 371 (c)(1),
(2), (4) Date: Sep. 30, 2011

(87) PCT Pub. No.: WO2010/113806
PCT Pub. Date: Oct. 7, 2010

(65) Prior Publication Data
US 2012/0037413 A1    Feb. 16, 2012

(30) Foreign Application Priority Data

Apr. 1, 2009 (JP) ................................ 2009-089276

(51) Int. Cl.
*H05K 1/03* (2006.01)

(52) U.S. Cl.
USPC ........... 174/262; 174/255; 174/260; 174/266; 29/830; 29/831; 29/846; 29/852

(58) Field of Classification Search
USPC ............ 174/262, 255, 260, 266; 29/830, 831, 29/846, 852
See application file for complete search history.

(56) References Cited

U.S. PATENT DOCUMENTS

| 5,166,493 | A  | * | 11/1992 | Inagawa et al. | 219/121.71 |
| 6,833,198 | B2 | * | 12/2004 | Sakamoto et al. | 428/596 |
| 8,129,625 | B2 | * | 3/2012 | Kato | 174/260 |
| 2001/0042637 | A1 | * | 11/2001 | Hirose et al. | 174/255 |
| 2003/0093899 | A1 | * | 5/2003 | Sakamoto et al. | 29/846 |
| 2004/0025333 | A1 | * | 2/2004 | Hirose et al. | 29/830 |

(Continued)

FOREIGN PATENT DOCUMENTS

| JP | 3-142090 A | 6/1991 |
| JP | 11-150369 A | 6/1999 |

(Continued)

OTHER PUBLICATIONS

International Search Report issued in PCT/JP2010/055401 dated May 11, 2010.

(Continued)

*Primary Examiner* — Xiaoliang Chen
(74) *Attorney, Agent, or Firm* — Birch, Stewart, Kolasch & Birch, LLP (57) ABSTRACT

An object of the invention is to provide a method for fabricating a printed wiring board that can suppress warping of the printed wiring board and can improve the yield of semiconductor chip mounting and enhance the reliability of a semiconductor package. The printed wiring board fabrication method according to the invention is a method for fabricating a printed wiring board having a through-hole in a core layer, wherein the printed wiring board fabrication method includes the step of applying a laser from one side of the core layer to a position where the through-hole is to be formed in the core layer and the step of applying a laser to the same position from the opposite side of the core layer.

11 Claims, 2 Drawing Sheets

(56) References Cited

U.S. PATENT DOCUMENTS

2007/0029106 A1* 2/2007 Kato .............................. 174/255
2008/0173473 A1* 7/2008 Hirose et al. ................... 174/266
2008/0189943 A1* 8/2008 Hirose et al. ..................... 29/852

FOREIGN PATENT DOCUMENTS

| JP | 2000-91750 A | 3/2000 |
| JP | 2004-322173 A | 11/2004 |
| JP | 2004-335655 A | 11/2004 |
| JP | 2007-29952 A | 2/2007 |

OTHER PUBLICATIONS

Office Action issued Jan. 10, 2014, in Japanese Patent Application No. 2011-507156.

* cited by examiner

PRINTED WIRING BOARD FABRICATION METHOD, PRINTED WIRING BOARD, MULTILAYER PRINTED WIRING BOARD, AND SEMICONDUCTOR PACKAGE

TECHNICAL FIELD

The present invention relates to a printed wiring board fabrication method, a printed wiring board, a multilayer printed wiring board, and a semiconductor package.

BACKGROUND ART

With the recent need for higher functionality and smaller and lighter electronic products, the trend toward higher integration and higher packing density of electronic components has been accelerating, and semiconductor packages used in these electronic products have been shrinking in size and thickness more than ever before (for example, refer to cited document 1).

With the trend toward smaller semiconductor packages, the wiring circuit density has been increasing, and through-holes for providing electrical connections between the upper and lower surfaces of the internal layers have come to be formed at higher density and with smaller diameter. Since there is a limit to how small the through-holes can be formed by a conventional method using a mechanical drill, laser drilling has come to be employed in recent years in place of mechanical drilling (for example, refer to cited document 2). Using a $CO_2$ laser or a UV-YAG laser, through-holes can be drilled to a diameter smaller than 100 μm which was the smallest diameter that was possible with conventional mechanical drilling.

Further, in the case of mechanical drilling, when drilling through-holes as small as about 100 μm, the blade of the drill can easily break, tending to cause a problem in drilling; in contrast, with laser drilling which does not use any consumable parts, such through-holes can be efficiently drilled. Furthermore, since smaller-diameter through-holes can be drilled, the spacing of the through-holes can be reduced, and as a result, the size of the printed wiring board can be reduced.

Further, since equipment such as a $CO_2$ laser drill and a UV-YAG laser drill is already in widespread use for drilling interlayer connecting microvias in printed wiring boards, there is often no need to newly design a laser drill for through-hole drilling.

PRIOR ART DOCUMENTS

Patent Documents

Patent document 1: Japanese Unexamined Patent Publication No. 2003-179350
Patent document 2: Japanese Unexamined Patent Publication No. 2007-227962

SUMMARY OF THE INVENTION

Problem to be Solved by the Invention

However, the above prior art has had room for improvement as follows.

When a through-hole is drilled by a laser drill, the diameter of the resulting through-hole opening becomes different between the laser incident side and the laser exit side of the core layer of the drilled printed wiring board. More specifically, in the case of a through-hole drilled by a laser drill, the diameter of the hole opening is the largest at the surface on the laser incident side and the smallest at the surface on the laser exit side, i.e., the hole has a so-called tapered profile. As a result, the area size of the resin film or copper foil coating the core layer is different between the front and back surfaces of the core layer. Since this difference in coating area becomes pronounced as the number of through-holes formed in the core layer increases, warping of the core layer, and hence, warping of the printed wiring board, may eventually result.

If warping occurs in the printed wiring board before a semiconductor chip is mounted thereon, a solder bump connection failure may occur when the semiconductor chip is mounted. Further, when a temperature cycling test is conducted after mounting the semiconductor chip, since stresses are applied to the solder bumps, the solder bumps may be cracked or the semiconductor chip itself may break, and hence a degradation of the reliability of the semiconductor package.

The present invention has been devised in view of the above situation in order to solve the problem associated with the prior art, and an object of the invention is to provide a method for fabricating a printed wiring board that can suppress warping of the printed wiring board and can improve the yield of semiconductor chip mounting and enhance the reliability of the semiconductor package.

Means for Solving the Problem

The above object is achieved by the present invention described in items [1] to [10] below.

[1] A method for fabricating a printed wiring board having a through-hole in a core layer, wherein the printed wiring board fabrication method includes the step of applying a laser from one side of the core layer to a position where the through-hole is to be formed in the core layer and the step of applying a laser to the same position from the opposite side of the core layer.

[2] A printed wiring board fabrication method as described in item [1], wherein the laser is a $CO_2$ laser.

[3] A printed wiring board fabrication method as described in item [1] or [2], wherein operating conditions for applying the laser are as follows: pulse duration is not shorter than 3 μsec but not longer than 100 μsec, energy is not smaller than 5 mJ but not greater than 20 mJ, and the number of shots is not smaller than 1 but not larger than 5.

[4] A printed wiring board fabrication method as described in any one of items [1] to [3], wherein operating conditions for applying the laser from the one side are different from operating conditions for applying the laser from the opposite side.

[5] A printed wiring board fabrication method as described in any one of items [1] to [4], wherein operating conditions for applying the laser from the opposite side are as follows: pulse duration is not shorter than 15 μsec but not longer than 100 μsec, energy is not smaller than 5 mJ but not greater than 20 mJ, and the number of shots is not smaller than 1 but not larger than 2.

[6] A printed wiring board fabrication method as described in any one of items [1] to [5], wherein the core layer has a thickness not smaller than 0.04 mm but not greater than 0.4 mm.

[7] A printed wiring board fabrication method as described in any one of items [1] to [6], wherein the core layer has a modulus of elasticity not lower than 10 GPa but not higher than 50 GPa at 25° C., and a modulus of elasticity not lower than 3 GPa but not higher than 50 GPa at 250° C.

[8] A printed wiring board which is fabricated by a printed wiring board fabrication method as described in any one of items [1] to [7].

[9] A multilayer printed wiring board which is fabricated by forming an insulating layer and an electrically conductive layer on a printed wiring board fabricated by a printed wiring board fabrication method as described in any one of items [1] to [7].

[10] A semiconductor package which is fabricated by mounting a semiconductor device on a printed wiring board as described in item [8] or on a multilayer printed wiring board as described in item [9].

Advantageous Effect of the Invention

The printed wiring board fabricated by the printed wiring board fabrication method according to the present invention is substantially free from warping and serves to improve the yield of semiconductor chip mounting and enhance the reliability of the semiconductor package.

MODE FOR CARRYING OUT THE INVENTION

The present invention concerns a method for fabricating a printed wiring board having a through-hole in a core layer, wherein the printed wiring board fabrication method includes the step of applying a laser from one side of the core layer to a position where the through-hole is to be formed in the core layer and the step of applying a laser to the same position from the opposite side of the core layer. According to this method, it is possible to suppress warping of the printed wiring board.

Embodiments of the present invention will be described in detail below. However, the present invention is not limited to the specific embodiments disclosed herein.

Figure 1:
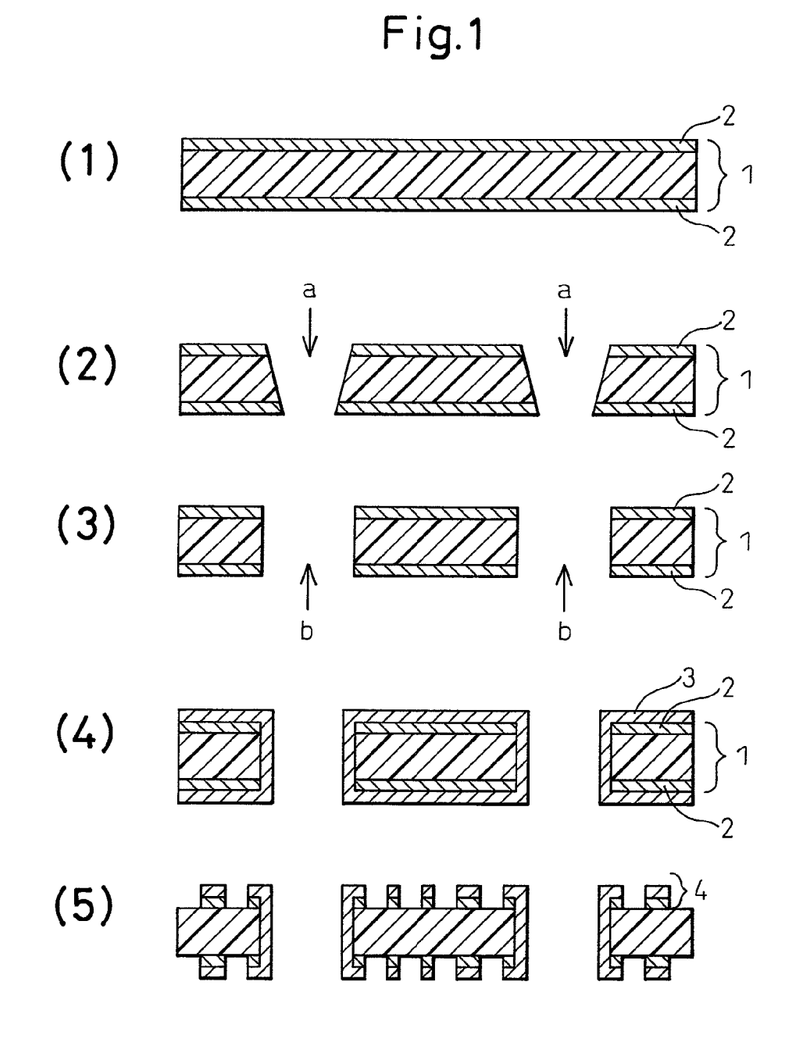
FIG. 1 is a schematic cross-sectional diagram illustrating one example of a printed wiring board fabrication method according to the present invention.

The present invention provides a method for fabricating a printed wiring board having a through-hole in a core layer of the printed wiring board (FIG. 1), wherein the printed wiring board fabrication method includes the step of applying a laser from one side of the core layer to a position where the through-hole is to be formed in the core layer (FIG. 1(2)) and the step of applying a laser to the same position from the opposite side of the core layer (FIG. 1(3)).

While the following description deals with a mode in which the through-hole is opened through the core layer by the first laser application from the one side of the core layer, a mode in which the through-hole is not opened through the core layer by the first laser application but is opened through it by the subsequent laser application from the opposite side also falls within the scope of the present invention.

There are two methods of forming a through-hole in the core layer: one is drilling the through-hole by applying the laser directly onto a copper foil formed on the surface of the core layer, and the other is etching the copper foil on the surface of the core layer in the designated position where the through-hole is to be opened and drilling the through-hole by applying the laser to the etched portion.

In the method of drilling the through-hole by applying the laser directly onto the copper foil, a UV-YAG laser or a $CO_2$ laser is used, and the surface of the copper foil is roughened. For the roughening, it is preferable to use a bond film process (manufactured by Atotech), a CZ process (manufactured by MEC), or a black oxide process, among which the black oxide process is particularly preferred.

In the step of forming the through-hole by applying the laser from one side (front side) of the core layer, first the laser is applied from the front side in order to form the through-hole in the roughened core layer. The laser operating conditions in this case are preferably as follows: the pulse duration is not shorter than 3 μsec but not longer than 100 μsec, the energy is not smaller than 5 mJ but not greater than 20 mJ, and the number of shots is not smaller than 1 but not larger than 5; more preferably, the pulse duration is not shorter than 16 μsec but not longer than 100 μsec, the energy is not smaller than 10 mJ but not greater than 20 mJ, and the number of shots is not smaller than 3 but not larger than 5.

Next, in the step of forming the through-hole by applying the laser from the opposite side (back side) of the core layer, the laser is applied to the position on the back side corresponding to the laser applied position on the front side, from the back side of the core layer in which the through-hole has been formed by applying the laser from the front side. The laser operating conditions in this case are preferably as follows: the pulse duration is not shorter than 3 μsec but not longer than 100 μsec, the energy is not smaller than 5 mJ but not greater than 20 mJ, and the number of shots is not smaller than 1 but not larger than 2; more preferably, the pulse duration is not shorter than 16 μsec but not longer than 100 μsec, the energy is not smaller than 10 mJ but not greater than 20 mJ, and the number of shots is not smaller than 1 but not larger than 2.

By thus applying the laser to the same portion of the core layer from both the front and back sides thereof, a through-hole substantially free from tapering can be formed, and warping of the core layer can thus be suppressed. According to a typical example of the present invention, the through-hole is formed by applying at least one shot of laser from the front side of the core layer and at least one shot from the back side, that is, at least two shots in total, to the portion of the core layer where the through-hole is to be formed. As an alternative mode of the present invention, the laser may be applied simultaneously from the front and back sides of the core layer to the portion of the core layer where the through-hole is to be formed.

In the method of drilling the through-hole by applying the laser to the etched portion of the copper foil in the position where the through-hole is to be opened, a $CO_2$ laser is used, and in the step of forming the through-hole by applying the laser from the front side of the core layer, first the laser is applied from the front side of the core layer. The laser operating conditions in this case are preferably as follows: the pulse duration is not shorter than 3 μsec but not longer than 100 μsec, the energy is not smaller than 5 mJ but not greater than 20 mJ, and the number of shots is not smaller than 1 but not larger than 5; more preferably, the pulse duration is not shorter than 16 μsec but not longer than 100 μsec, the energy is not smaller than 10 mJ but not greater than 20 mJ, and the number of shots is not smaller than 3 but not larger than 5.

Next, in the step of forming the through-hole by applying the laser from the back side of the core layer, the laser is applied to the position on the back side corresponding to the laser applied position on the front side, from the back side of the core layer in which the through-hole has been formed by applying the laser from the front side. The laser operating conditions in this case are preferably as follows: the pulse duration is not shorter than 3 μsec but not longer than 100 μsec, the energy is not smaller than 5 mJ but not greater than 20 mJ, and the number of shots is not smaller than 1 but not larger than 2; more preferably, the pulse duration is not shorter than 16 μsec but not longer than 100 μsec, the energy is not smaller than 10 mJ but not greater than 20 mJ, and the number of shots is not smaller than 1 but not larger than 2.

By thus applying the laser to the same portion of the core layer from both sides thereof, a through-hole substantially free from tapering can be formed, and warping of the core layer can thus be suppressed.

The same laser operating conditions may be used for both the step of forming the through-hole by applying the laser from the front side of the core layer and the step of forming the through-hole by applying the laser from the back side thereof, but it is preferable to change the conditions between them.

More specifically, it is preferable that the number of laser shots applied from the front side is larger than the number of laser shots applied from the back side, because warping of the printed wiring board can then be further reduced. As for the order of laser application, the laser may be applied first from the front side, and then from the back side. Alternatively, the laser may be applied simultaneously from the front and back sides of the core layer by using the same or different laser operating conditions.

The number of through-holes is generally between 10 to 12000 per square centimeter of the core layer, and preferably within the range of 200 to 1000 per square centimeter of the core layer. If the number of through-holes is smaller than 10 per square centimeter of the core layer, it may not be possible to produce a printed wiring board suitable for fine wiring; conversely, if the number of through-holes is larger than 12000 per square centimeter of the core layer, the through-hole spacing becomes too small, and the wall-to-wall reliability under long-term moisture absorption conditions may drop.

In the printed wiring board fabrication method of the present invention, it is preferable to use a core layer whose thickness is not smaller than 0.04 mm but not greater than 0.4 mm, whose modulus of elasticity (Young modulus) at 25° C. is not lower than 10 GPa but not higher than 50 GPa, and whose modulus of elasticity at 250° C. is not lower than 3 GPa but not higher than 50 GPa. The reason is that such a core layer is particularly suitable for the formation of through-holes by laser. If the thickness is smaller than the above range, the yield of semiconductor chip mounting and the reliability of the semiconductor package may suffer; conversely, if the thickness is greater than the above range, it becomes difficult to form through-holes by laser. In particular, if the intensity of laser radiation is high, the insulating layer of the core layer may be carbonized and, in a subsequent etching step, the carbonized portions may delaminate from the surfaces of the through-holes, resulting in a degradation of insulation reliability. If the intensity of laser radiation is low, glass cloth burrs may occur, which can roughen the interior surfaces of the through-holes and can result in a plating failure.

The material for the insulating layer of the core layer need only have a suitable strength and is not limited to any particular material, but advantageous use can be made of a semi-cured plate-like material (generally referred to as "prepreg") formed by semi-curing a material prepared by impregnating a fiber base material (for example, a glass fiber sheet) with a resin composition containing, for example, at least one or a plurality of kinds of resins selected from the group consisting of an epoxy resin, a phenolic resin, a cyanate resin, a triazine resin, a bismaleimide resin, a polyimide resin, a polyamide-imide resin, a polyphenylene oxide resin, and a benzocyclobutene resin. Among others, a semi-cured plate-like material (generally referred to as "prepreg") formed by semi-curing a material prepared by impregnating a fiber base material (for example, a glass fiber sheet) with a resin composition containing an epoxy resin and an inorganic filler can be used advantageously.

Next, the printed wiring board will be described.

The printed wiring board of the present invention includes a laminated board in which at least one prepreg described above is formed. This achieves a printed wiring board that has excellent dielectric characteristics and has excellent mechanical and electrical connection reliability under high-temperature, high-humidity conditions.

When the number of prepregs used in the laminated board is 1, a metal foil or a film is formed over one or both of the upper and lower surfaces of the prepreg. Alternatively, two or more prepregs may be used in lamination. When using two or more prepregs in lamination, a metal foil or a film is formed over one or both of the upper and lower surfaces of the outermost prepregs laminated together. Next, the structure formed by laminating together the prepreg, metal foil, etc., is heated under pressure, to complete the fabrication of the laminated board. The heating temperature is not specifically limited, but preferably not lower than 120° C. but not higher than 220° C., and more preferably not lower than 150° C. but not higher than 200° C. Further, the applied pressure is not specifically limited, but preferably not lower than 2 MPa but not higher than 5 MPa, and more preferably not lower than 2.5 MPa but not higher than 4 MPa.

Examples of the film used in the laminated board include polyethylene, polypropylene, polyethylene terephthalate, polyimide, fluoro-based resin, etc.

Examples of the metal foil used in the laminated board include a copper and/or copper-based alloy, an aluminum and/or aluminum-based alloy, a silver and/or silver-based alloy, a gold and/or gold-based alloy, a zinc and/or zinc-based alloy, a nickel and/or nickel-based alloy, a tin and/or tin-based alloy, an iron and/or iron-based alloy, etc.

As the metal foil, use may also be made of an ultra-thin metal foil backed with a carrier foil. An ultra-thin metal foil backed with a carrier foil is a metal foil formed by laminating a peelable carrier foil to an ultra-thin metal foil. By using such a carrier foil-backed ultra-thin metal foil, an ultra-thin metal foil can be formed on both surfaces of the laminated board; accordingly, when forming a circuit by using a semi-additive process, for example, the circuit can be formed without performing electroless plating but by performing electrolytic plating using the ultra-thin metal foil directly as the feed layer, and after that, the ultra-thin copper foil can be removed by flash etching. Further, using such a carrier foil-backed ultra-thin metal foil offers the effect of being able to prevent degradation of the handling characteristics of the ultra-thin metal foil and breakage or tearing of the ultra-thin copper foil, for example, during the pressing step even when the ultra-thin metal foil is as thin as 10 μm or less. The thickness of the ultra-thin metal foil is preferably not smaller than 0.1 μm but not greater than 10 μm. More preferably, the thickness is not smaller than 0.5 μm but not greater than 5 μm, and even more preferably not smaller than 1 μm but not greater than 3 μm. If the thickness of the ultra-thin metal foil is smaller than the above lower limit value, there may arise defects such as scratching of the ultra-thin metal foil after peeling the carrier foil, formation of pinholes in the ultra-thin metal foil, plating variations during the formation of a circuit pattern due to pinholes, breaks in circuit wiring lines, and soaking of chemical solutions such as an etching solution, desmear solution, etc. Conversely, if the thickness is greater than the above upper limit value, variations in the thickness of the ultra-thin metal foil or variations in the surface roughness of the roughened surface of the ultra-thin metal foil may become large.

Usually, the carrier foil is peeled off the carrier foil-backed ultra-thin metal foil before forming a circuit pattern on the laminated board after press forming.

The printed wiring board can be fabricated by using the above laminated board.

The fabrication method is not specifically limited, but use may be made, for example, of a subtractive process, semi-additive process, etc. For example, by using a $CO_2$ laser, through-holes are formed by the fabrication method of the present invention in the desired positions in the laminated board having copper foils formed on both surfaces thereof, and conductive paths between the upper and lower surfaces of the laminated board are formed by electroless plating. Then, the copper foils are etched to form internal layer circuits, thus completing the fabrication of the printed wiring board. If the printed wiring board with the internal layer circuits thus formed is to be used as a semiconductor device mounting board, insulating layers are formed on the outermost layers.

If the above printed wiring board is to be used as an internal layer circuit board, a board roughened by a black oxide process or the like can be used advantageously as the internal layer circuit board. Further, the through-holes can be filled with a conductive paste or a resin paste, as needed.

To fabricate a multilayer printed wiring board, an insulating resin layer is formed by laminating a prepreg or a film-backed insulating resin sheet onto the printed wiring board with the internal layer circuits, in such a manner as to cover the internal layer circuits formed thereon. The lamination method is not specifically limited, but it is preferable to use a method of laminating using a vacuum press, a low-pressure laminator, or a laminator that heats and applies pressure under a vacuum, and the method using a laminator that heats and applies pressure under a vacuum is particularly preferable.

Thereafter, the insulating resin layer is cured by heating. The curing temperature is not specifically limited, but the layer can be cured, for example, at temperatures not lower than 100° C. but not higher than 250° C. Preferably, the curing temperature is not lower than 150° C. but not higher than 200° C.

Next, vias are formed in the insulating resin layer by using a $CO_2$ laser device, and an external layer circuit is formed on the surface of the insulating resin layer by electrolytic copper plating; then, electrical connections are made between the external and internal layer circuits. The external layer circuit is provided with connection electrodes for semiconductor device mounting.

After that, a solder resist is formed on the outermost layer, and the connection electrodes for semiconductor device mounting are exposed by exposure and development, plated with nickel/gold, and cut to a prescribed size, to complete the fabrication of the multilayer printed wiring board.

The semiconductor package of the present invention is fabricated by mounting a semiconductor device on the above fabricated printed wiring board or multilayer printed wiring board and by sealing the semiconductor device with a sealing material. Examples include such semiconductor packages as a ball grid array (BGA), chip-scale package (CSP), flip-chip BGA, etc.

WORKING EXAMPLES

The present invention will be described in detail below with reference to working examples and comparative examples, but the present invention is not limited to these specific examples.

Working Example 1

A double-sided copper-clad laminated board A of thickness 0.1 mm (ELC-4785GS manufactured by Sumitomo Bakelite and having a modulus of elasticity of 34 GPa at 25° C. Hereinafter called "double-sided board A." See FIG. 1(1)) was used as the core layer. A copper foil mask for laser drilling was formed by etching circular windows of 100 μm diameter into the copper foil on one side at positions where holes are to be opened through the double-sided board A.

Next, in the step of forming through-holes by applying a laser from one side (front side) of the double-sided board A, a laser (a) having a diameter greater than that of the laser drilling copper foil mask was used. The mask at the laser side was set at 1.4 mmΦ, and two shots of laser were applied by setting the laser output energy at 2.5 mJ and the pulse duration at 67 μs (FIG. 1(2)). The number of through-holes formed was 80 per square centimeter of the core layer.

Next, in the step of forming through-holes by applying a laser from the opposite side (back side) of the double-sided board A, the double-sided board A was turned over, and a laser (b) was applied to the same position as above with the same conditions as those used to apply the laser from the front side, to obtain a double-sided board formed with through-holes each having substantially the same diameter at both open ends (FIG. 1(3)). In this example, to form the through-holes, one laser shot was applied from the front side and another shot was applied to the same position from the back side, i.e., a total of two shots were applied.

A printed wiring board was fabricated by forming circuits on both sides of the double-sided board A (FIGS. 1(4) and 1(5)) and thereafter forming a solder resist on the outermost layer.

Further, a multilayer printed wiring board was fabricated by forming circuits on both sides of the double-sided board A (FIGS. 1(4) and 1(5)) followed by the formation of insulating resin layers (ABF GX-13 manufactured by Ajinomoto Fine-Techno) on both sides, then forming vias using a carbon dioxide laser, followed by the formation of an external layer circuit on the surface of each insulating resin layer by electrolytic copper plating, and finally forming a solder resist on the outermost layer.

Using the thus fabricated printed wiring board and multilayer printed wiring board, semiconductor packages (semiconductor device size: 15 mm×15 mm, semiconductor device thickness: 725 μm, bump size: 100 μm, bump pitch: 200 μm) were fabricated by mounting semiconductor devices using flip-chip technology on the printed wiring board and the multilayer printed wiring board, respectively, and thereafter sealing the semiconductor devices with an underfill material (SUMIRESIN EXCEL CRP-4160 manufactured by Sumitomo Bakelite). The semiconductor package fabricated using the printed wiring board was designated as the semiconductor device (1), and the semiconductor package fabricated using the multilayer printed wiring board was designated as the semiconductor device (2).

Evaluations were conducted using the following method, and the results are shown in Table 1.

[Evaluation Method]

1. Through-hole Shape of Double-sided Board

The cross-sectional shape of the through-holes formed in the double-sided board A was observed on the double-sided board formed with the through-holes as described above, and the board having a non-tapered through-hole shape was designated "○", while the board having a tapered through-hole shape was designated "x". The evaluation criteria were as follows.

The diameter of the through-hole opening at the front side was designated Φ(1), and the diameter of the opening at the back side was designated Φ(2).

○: Non-tapered (Φ(2)/Φ(1)≥0.9)

x: Tapered (Φ(2)/Φ(1)<0.9)

2. Evaluation of Warpage of Printed Wiring Board and Multilayer Printed Wiring Board Using a laser three-dimensional shape measuring instrument (LS220-MT manufactured by Hitachi Technologies and Services), warpage at room temperature was measured on the printed wiring board (double-sided board formed with through-holes) and the multilayer printed wiring board fabricated as described above, and the results are shown in Table 1. The measuring range was 15 mm×15 mm, and the difference between the farthest point and the nearest point as measured from the laser head was calculated as the warpage value, which was evaluated as follows.

○: Warpage value<50 μm
Δ: 50 μm≤Warpage value≤80 μm
x: Warpage value>80 μm

3. Evaluation of Semiconductor Packages (Warpage and Reliability)

Warpage and reliability were evaluated on the semiconductor devices (1) and (2) fabricated as described above.

Warpage was evaluated in the same manner as the double-sided board and the printed wiring board described above; that is, warpage at room temperature was measured using the laser three-dimensional shape measuring instrument (LS220-MT manufactured by Hitachi Technologies and Services). The measuring range was 15 mm×15 mm, i.e., the same size as the semiconductor chip size, and the measurement was conducted by applying laser to the BGA surface on the side opposite from the semiconductor chip mounting side; then, the difference between the farthest point and the nearest point as measured from the laser head was calculated as the warpage value, which was evaluated as follows.

○: Warpage value<200 μm
Δ: 200 μm≤Warpage value≤250 μm
x: Warpage value>250 μm

The reliability of the above semiconductor devices (1) and (2) was evaluated by repeating a temperature cycling test (between −55° C. and 125° C.) 1000 cycles and thereafter performing a conduction test; then, the device with a conduction failure was designated "x", and the device with no conduction failure was designated "○".

Working Example 2

As in working example 1, in the step of forming through-holes by applying a laser from the front side of the double-sided board A on which the laser drilling copper mask has been formed, a laser (a) having a diameter greater than that of the laser drilling copper foil mask was used. The mask at the laser side was set at 1.4 mmΦ, and two shots of laser were applied by setting the laser output energy at 2.5 mJ and the pulse duration at 67 μs (FIG. 1(2)). The number of through-holes formed was 80 per square centimeter of the core layer.

Next, in the step of forming through-holes by applying a laser from the back side of the double-sided board A, the core layer was turned over, and the mask at the laser side was set at 1.4 mmΦ; then, one shot of laser (b) was applied to the same position as above by setting the laser output energy at 2.5 mJ and the pulse duration at 67 μs, to obtain a double-sided board formed with through-holes each having substantially the same diameter at both open ends (FIG. 1(3)).

The printed wiring board and the semiconductor package were fabricated using the thus obtained double-sided board, and were evaluated in the same manner as in working example 1.

Working Example 3

A double-sided board with through-holes was fabricated in the same manner as in working example 1, except that in the step of forming through-holes by applying a laser from the back side of the double-sided board A, the mask at the laser side was set at 1.4 mmΦ and five shots of laser were applied by setting the laser output energy at 6.0 mJ and the pulse duration at 67 μs. The number of through-holes formed was 120 per square centimeter of the core layer.

The printed wiring board and the semiconductor package were fabricated using the thus obtained double-sided board, and were evaluated in the same manner as in working example 1.

Working Example 4

A double-sided board with through-holes was fabricated in the same manner as in working example 1, except that in the step of forming through-holes by applying a laser from the back side of the double-sided board A, the mask at the laser side was set at 1.4 mmΦ and three shots of laser were applied by setting the laser output energy at 9.0 mJ and the pulse duration at 67 μs. The number of through-holes formed was 80 per square centimeter of the core layer.

The printed wiring board and the semiconductor package were fabricated using the thus obtained double-sided board, and were evaluated in the same manner as in working example 1.

Working Example 5

A double-sided board with through-holes was fabricated in the same manner as in working example 1, except that in the step of forming through-holes by applying a laser from the back side of the double-sided board A, the mask at the laser side was set at 1.4 mmΦ and five shots of laser were applied by setting the laser output energy at 3.0 mJ and the pulse duration at 10 μs. The number of through-holes formed was 80 per square centimeter of the core layer.

The printed wiring board and the semiconductor package were fabricated using the thus obtained double-sided board, and were evaluated in the same manner as in working example 1.

Working Example 6

A double-sided board with through-holes was fabricated in the same manner as in working example 1, except that the thickness of the double-sided board A was 0.2 mm. The number of through-holes formed was 80 per square centimeter of the core layer.

The printed wiring board and the semiconductor package were fabricated using the thus obtained double-sided board, and were evaluated in the same manner as working example 1.

Working Example 7

A double-sided board with through-holes was fabricated in the same manner as in working example 1, except that a double-sided copper-clad laminated board B of thickness 0.1 mm (E679FG-B manufactured by Hitachi Chemical and having a modulus of elasticity of 27 GPa at 25° C.) was used. The number of through-holes formed was 80 per square centimeter of the core layer.

The printed wiring board and the semiconductor package were fabricated using the thus obtained double-sided board, and were evaluated in the same manner as in working example 1.

Comparative Example 1

A double-sided board with through-holes was fabricated in the same manner as in working example 1, except that the process of applying a laser from the back side of the double-sided board A was omitted. The number of through-holes formed was 80 per square centimeter of the core layer.

Figure 2:
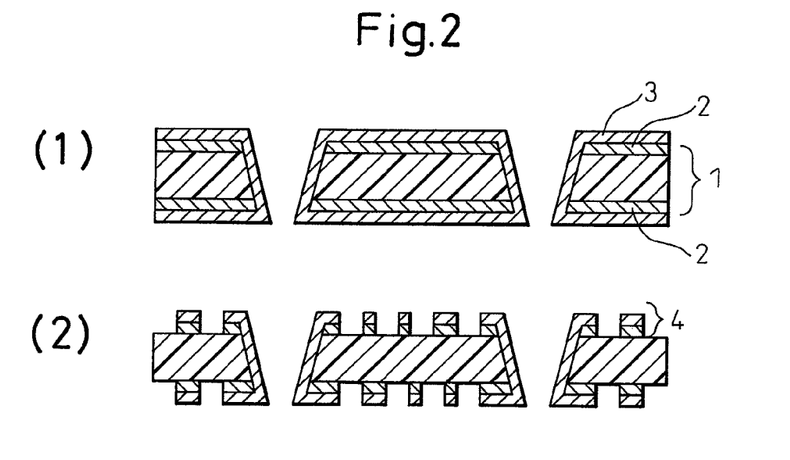
FIG. 2 is a schematic cross-sectional diagram illustrating one example of a printed wiring board fabrication method according to the prior art.

The printed wiring board and the semiconductor package were fabricated using the thus obtained double-sided board, and were evaluated in the same manner as in working example 1. The fabricated printed wiring board had tapered through-holes, as illustrated in the schematic cross-sectional views of FIGS. 2(1) and 2(2).

Comparative Example 2

A double-sided board with through-holes was fabricated in the same manner as in comparative example 1, except that in the step of forming through-holes by applying a laser from the front side of the double-sided board A, the mask at the laser side was set at 1.4 mmΦ and five shots of laser were applied by setting the laser output energy at 6.0 mJ and the pulse duration at 67 μs. The number of through-holes formed was 80 per square centimeter of the core layer.

The printed wiring board and the semiconductor package were fabricated using the thus obtained double-sided board, and were evaluated in the same manner as in working example 1.

Comparative Example 3

A double-sided board with through-holes was fabricated in the same manner as in comparative example 1, except that a double-sided copper-clad laminated board B of thickness 0.1 mm (E679FG-B manufactured by Hitachi Chemical and having a modulus of elasticity of 27 GPa at 25° C.) was used. The number of through-holes formed was 80 per square centimeter of the core layer.

The printed wiring board and the semiconductor package were fabricated using the thus obtained double-sided board, and were evaluated in the same manner as in working example 1.

board fabrication method includes the step of applying a laser from one side of said core layer to a position where said through-hole is to be formed in said core layer and the step of applying a laser to the same position from the opposite side of said core layer, and wherein said core layer has a modulus of elasticity not lower than 10 GPa but not higher than 50 GPa at 25° C., and a modulus of elasticity not lower than 3 GPa but not higher than 50GPa at 250° C.

2. The printed wiring board fabrication method as claimed in claim 1, wherein said laser is a CO2 laser.

3. The printed wiring board fabrication method as claimed in claim 1, wherein operating conditions for applying said laser are as follows: pulse duration is not shorter than 3 μsec but not longer than 100 μsec, energy is not smaller than 5 mJ but not greater than 20 mJ, and the number of shots is not smaller than 1 but not larger than 5.

4. The printed wiring board fabrication method as claimed in claim 1, wherein operating conditions for applying said laser from said one side are different from operating conditions for applying said laser from said opposite side.

5. The printed wiring board fabrication method as claimed in claim 1, wherein said core layer has a thickness not smaller than 0.04 mm but not greater than 0.4 mm.

6. The printed wiring board which is fabricated by a printed wiring board fabrication method as claimed in claim 1.

7. The multilayer printed wiring board which is fabricated by forming an insulating layer and an electrically conductive layer on a printed wiring board fabricated by a printed wiring board fabrication method as claimed in claim 6.

8. The semiconductor package which is fabricated by mounting a semiconductor device on a printed wiring board as claimed in claim 6.

9. The semiconductor package which is fabricated by mounting a semiconductor device on a multilayer printed wiring board as claimed in claim 7.

TABLE 1

| EVALUATION | | | WORKING EXAMPLES | | | | | | | COMPARATIVE EXAMPLES | | |
|---|---|---|---|---|---|---|---|---|---|---|---|---|
| | | | 1 | 2 | 3 | 4 | 5 | 6 | 7 | 1 | 2 | 3 |
| THROUGH-HOLE SHAPE | | | ◯ | ◯ | ◯ | ◯ | ◯ | ◯ | ◯ | X | X | X |
| WARPAGE OF PRINTED WIRING BOARD | | | ◯ | ◯ | ◯ | ◯ | ◯ | ◯ | ◯ | Δ | Δ | Δ |
| WARPAGE OF MULTILAYER PRINTED WIRING BOARD | | | ◯ | ◯ | ◯ | ◯ | ◯ | ◯ | ◯ | X | X | X |
| EVALUATION OF SEMICONDUCTOR DEVICES | SEMICONDUCTOR DEVICE (1) | WARPAGE | ◯ | ◯ | ◯ | ◯ | ◯ | ◯ | ◯ | X | X | X |
| | | RELIABILITY | ◯ | ◯ | ◯ | ◯ | ◯ | ◯ | ◯ | X | X | X |
| | SEMICONDUCTOR DEVICE (2) | WARPAGE | ◯ | ◯ | ◯ | ◯ | ◯ | ◯ | ◯ | X | X | X |
| | | RELIABILITY | ◯ | ◯ | ◯ | ◯ | ◯ | ◯ | ◯ | X | X | X |
| TOTAL EVALUATION | | | ◯ | ◯ | ◯ | ◯ | ◯ | ◯ | ◯ | X | X | X |

DESCRIPTION OF REFERENCE NUMERALS

1 . . . CORE LAYER (DOUBLE-SIDED BOARD)
2 . . . COPPER FOIL
3 . . . COPPER PLATING
a . . . DIRECTION OF LASER RADIATION FROM FRONT SIDE
b . . . DIRECTION OF LASER RADIATION FROM BACK SIDE
4 . . . CONDUCTOR CIRCUIT

What is claimed is:

1. A method for fabricating a printed wiring board having a through-hole in a core layer, wherein said printed wiring board fabrication method includes the step of applying a laser from one side of said core layer to a position where said through-hole is to be formed in said core layer and the step of applying a laser to the same position from the opposite side of said core layer, 10. The printed wiring board fabrication method as claimed in claim 2, wherein operating conditions for applying said laser are as follows: pulse duration is not shorter than 3 μsec but not longer than 100 μsec, energy is not smaller than 5 mJ but not greater than 20 mJ, and the number of shots is not smaller than 1 but not larger than 5.

11. A method for fabricating a printed wiring board having a through-hole in a core layer, wherein said printed wiring board fabrication method includes the step of applying a laser from one side of said core layer to a position where said through-hole is to be formed in said core layer and the step of applying a laser to the same position from the opposite side of said core layer, wherein said laser is a CO2 laser, and wherein conditions for applying said laser from said opposite side are as follows: pulse duration is not shorter than 15 μsec but not longer than 100 μsec, energy is not smaller than 5 mJ but not greater than 20 mJ, and the number of shots is not smaller than 1 but not larger than 2.

* * * * *